United States Patent [19]
Shimoda et al.

[11] Patent Number: 5,677,052
[45] Date of Patent: Oct. 14, 1997

[54] ALUMINUM NITRIDE CERAMICS AND METHOD FOR PREPARING THE SAME

[75] Inventors: Kouhei Shimoda; Kazuya Kamitake; Hirohiko Nakata; Kazutaka Sasaki; Masuhiro Natsuhara; Harutoshi Ukegawa, all of Hyogo, Japan

[73] Assignee: Sumitomo Electric Industries, Ltd., Osaka, Japan

[21] Appl. No.: 698,293

[22] Filed: Aug. 15, 1996

Related U.S. Application Data

[63] Continuation of Ser. No. 210,502, Mar. 18, 1994, abandoned.

[30] Foreign Application Priority Data

| Mar. 19, 1993 | [JP] | Japan | 5-085359 |
| Mar. 29, 1993 | [JP] | Japan | 5-093714 |
| Jun. 3, 1993 | [JP] | Japan | 5-157943 |
| Jul. 23, 1994 | [JP] | Japan | 5-202684 |

[51] Int. Cl.$^6$ .............. C04B 35/58; H05K 1/03
[52] U.S. Cl. .............. 428/336; 174/126.4; 174/137 B; 174/138 C; 428/212; 428/148; 428/156; 428/432; 428/457; 428/469; 428/698; 428/701
[58] Field of Search ............... 428/148, 156, 428/212, 336, 432, 457, 469, 698, 701, 702; 174/126.4, 137 B, 138 C

[56] References Cited

U.S. PATENT DOCUMENTS

| 4,756,976 | 7/1988 | Komeya et al. | 428/698 |
| 4,775,596 | 10/1988 | Holleran et al. | 428/432 |
| 4,840,853 | 6/1989 | Iio et al. | 428/572 |

FOREIGN PATENT DOCUMENTS

| 0374825 | 6/1990 | European Pat. Off. . |
| 62-170289 | 7/1988 | Japan . |
| 2-44084 | 2/1990 | Japan . |

OTHER PUBLICATIONS

English transaction of JP 63–1902075.
English translation of JP 63–170289.
Yoneda et al "Preparation of High Thermal Conductivity ALN ceramics & Metallization" IMC 1988 May 25–27, pp. 147–152.

Primary Examiner—Archene Turner
Attorney, Agent, or Firm—Foley & Lardner

[57] ABSTRACT

Aluminium nitride ceramics improved in heat radiation property used as a substrate for integrated circuits and package material, comprising a sintered article consisting mainly of aluminium nitride and having a thermal conductivity higher than 100·W/m·K at room temperature and a surface layer consisting mainly of aluminium nitride or oxide glass deposited on the sintered article.

A paste of aluminium nitride powder or oxide glass powder is coated on a surface of the sintered article of aluminium nitride and then is sintered to prepare a dense smooth surface layer.

19 Claims, 1 Drawing Sheet

1

ALUMINUM NITRIDE CERAMICS AND METHOD FOR PREPARING THE SAME

This application is a continuation, of application Ser. No. 08/210,502, filed Mar. 18, 1994 now abandoned.

BACKGROUND OF THE INVENTION

1. Field of the Invention

The present invention relates to aluminium nitride ceramics having improved heat-radiation property which can be used as a variety of electronics parts including a substrate for integrated circuits and packaging material.

2. Description of the Related Art

Aluminium nitride ceramic (or AlN ceramics, hereinafter) or a sintered article of aluminium nitride is obtained by sintering a powder material consisting mainly of aluminum nitride. This aluminium nitride ceramic possesses good insulation property, high mechanical strength and high thermal conductivity and is easy to be bonded to metal conductors and hence is expected to be used as a substrate for integrated circuits and packaging material.

When the AlN ceramic is used as a substrate for integrated circuits and packaging material, a metallized layer is usually deposited on a surface of the AlN ceramic, because electronic components such as transistor, diode, IC and LSI can not be mounted directly on the AlN ceramic. Such metallized layer is required also when a circuit pattern is printed on the surface of AlN ceramic.

In order to improve the thermal conductivity of AlN ceramics, it is a usual practice and an effective technique to grow crystalline particles of AlN so that grain boundaries are reduced or eliminated. However, a sintered article of AlN whose crystal particles are grown often possess voids or defects caused by lack of crystal particles, although its thermal conductivity is improved. A metallized layer deposited on such a defective surface of sintered article of AlN does not possess enough strength at an interface between the metallized layer and the sintered article of AlN and will be a cause of such troubles as breakage in circuit patterns and increment of resistivity in wiring lines.

Since two requirements to improve thermal conductivity and to improve surface smoothness are contradictory or trade-off, it is impossible to produce AlN ceramics possessing high thermal conductivity as well as high surface smoothness simultaneously by prior arts.

An object of the present invention is to solve the problems of known techniques and to provide AlN ceramics possessing high thermal conductivity as well as high surface smoothness and methods for producing the same.

SUMMARY OF THE INVENTION

The present inventors found that the above-mentioned contradictory two requirements to improve thermal conductivity and to improve surface smoothness cart be satisfied simultaneously by depositing a dense smooth surface layer on a surface of a sintered article of AlN.

The present invention provides a aluminum nitride ceramic comprising a sintered article consisting mainly of aluminium nitride and having a thermal conductivity higher than 100 W/m·K at room temperature and a smooth dense surface layer formed on a surface of the sintered article and having a surface roughness (Ra) of lower than 0.3 μm, no defect larger than 25 μm being found on a surface of the surface layer.

BRIEF DESCRIPTION OF THE DRAWING

The aluminum nitride ceramic according to the present invention has a structure shown in a cross section of FIG. 1.

A smooth dense surface layer (2) is formed on a surface of a sintered article (1) consisting mainly of aluminium nitride and having a thermal conductivity higher than 100 W/m·K at room temperature. The surface layer (2) has a surface roughness (Ra) of lower than 0.3 μm and no defect larger than 25 μm is found on a surface of the surface layer (2).

Figure 1:
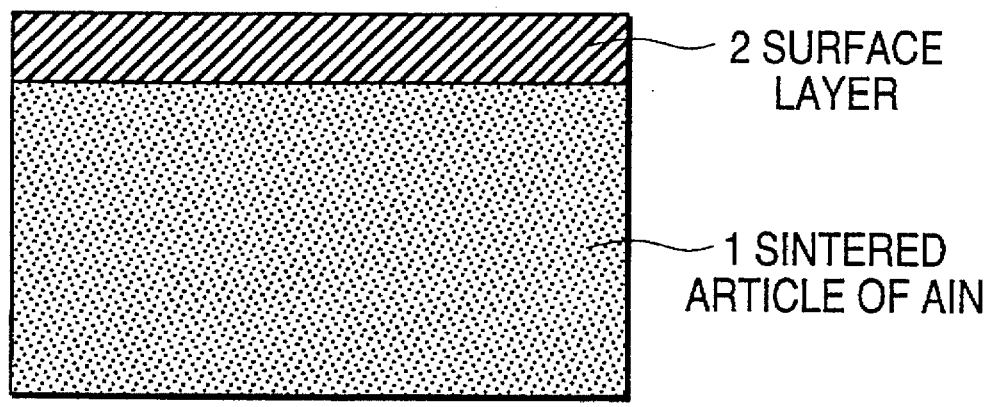

Preferable thickness of the surface layer (2) is 10 to 250 μm. Particles or grains of which the aluminium nitride sintered article (1) is made have preferably particle sizes of larger than 2 μm. Preferably, the surface layer (2) consists mainly of aluminium nitride or oxide glass. In case of oxide glass is used as the surface layer (2), oxide glass possess preferably a thermal expansion coefficient of 3.0 to 6.0 ppm/° C. The surface layer may have a multi-layered structure consisting of a plurality of oxide glass layers. Differences in softening points of oxide glass layers are preferably larger than 5° C. Preferably, each of the oxide glass layers has a thickness of of 1 to 100 μm. At least the tint oxide glass layer deposited directly on a surface of the sintered article is preferably made of oxide glass which do not contain Ns, K, Rb and Pb.

The present invention provides also a method for producing aluminium nitride ceramic having a dense smooth surface layer possessing a surface roughness (Ra) of lower than 0.3 μm and possessing no defect larger than 25 μm on its surface, characterized by the steps of applying a paste for said surface layer onto a surface of a sintered article or a none sintered preform of aluminium nitride and sintering said paste together with said preform if the later exists.

The resulting surface layer is further polished optionally after sintering. The paste contain preferably more than 50% by weight of aluminium nitride powder or oxide glass powder. Oxide glass possess preferably a thermal expansion coefficient of 3.0 to 6.0 ppm/°C. The surface layer can be prepared by repeating two steps of applying an oxide glass paste onto a sintered article of AlN and sintering the oxide glass paste for more than one time, or by effecting sintering of all oxide glass paste layers formed on a sintered article at one time. At least the first oxide glass layer deposited directly on a surface of the sintered article is preferably made of oxide glass which do not contain Na, K, Rb and Pb. Preferably a surface of the sintered article of aluminium nitride is oxidized before the paste of oxide glass is coated. The oxidation is carried out preferably at a temperature between 200° and 1,300 ° C.

The content of AlN in the sintered article of AlN is preferably more than 80% by weight and more preferably more than 93% by weight in order to obtain high thermal conductivity.

The sintered article of AlN can contain the other components such as the conventional sintering aids of IIa and IIIa group elements, known coloring agents of IVa, Va and VIa group elements, oxygen, boron, carbon or the like in addition to inevitable impurities such as Fe, Si etc.

The IIa and IIIa group elements for sintering aids can present in a form of their oxides, fluorinated oxides and aluminate in the sintered article of AlN or more than one compound selected from a group consisting of oxides, carbides and nitrides of IIa group elements and/or IIIa group elements and compounds which will produce them when the compounds are sintered can be added. The proportion of IIa and IIIa group elements or their compounds is 0.01 to 10% by weight, preferably 0.1 to 5% by weight in term of element. If this proportion become lower than 0.1%, it is difficult to obtain dense fine sintered article of AlN because so-called the packaging or densification effect by sintering aid can not be expected. On the contrary, if the proportion exceeds 5%, excess liquid phase oozes out of a surface of the sintered article, resulting in a trouble of unstable spotted color tone on the final sintered product When a black-colored sintered article of AlN is desired, compounds of IVa, Va and VIa group elements which are known as coloring agents can be added to a material for the sintered article of AlN. The IVa, Va and VIa group elements can be added in a form of compound(s) selected from a group consisting of oxides, carbides, nitrides, borides and compounds which will produce them by sintering. It is preferable to disperse the compounds of IVa, Va and VIa group elements as fine and uniform as possible in order to improve the coloring effect. The coloring effect become remarkable when the particle size of crystal particles or grains of AlN becomes larger than 1.0 μm and in particular, in a range of 2 to 15 μm.

The "particle size" means, in this specification, an average of the maximum dimensions of particles (usually, more than 30 particles) when a cut or slit section of a sintered article of AlN is observed by a scanning electron microscope (SEM) or the like.

If the particle size of crystal particles of AlN exceeds 15 μm, coloring become difficult with little improvement in the thermal conductivity.

The ratio of the particle size of crystal particles of AlN to the particle size of the compound of IVa, Va and VIa elements is preferably selected higher than 2.0 so as to improve both of thermal conductivity and coloring property.

In a sintered article of AlN, oxygen present mainly in two forms of (1) aluminate resulting from a reaction with a sintering aid and (2) aluminium oxide-nitride in which oxygen dissolved in sintered particles as solid-solution. The oxygen content after an amount of oxygen converted to aluminates is deducted from the total oxygen in the sintered article of AlN is preferably reduced to lower than 2% by weight, more preferably lower than 1% by weight. If the oxygen content increase, thermal conductivity of the sintered article of AlN become lower. In fact, if the oxygen content becomes higher than 2% by weight, the thermal conductivity become low or unstable.

The carbon content in the sintered article of AlN is preferably in a range from 0.005 to 0.5% by weight. If the carbon content becomes lower than the minimum value of this range, it is impossible to produce a sintered article of AlN having high thermal conductivity. On the other hand, if the carbon content exceeds the maximum value of this range, liquid aluminates produce with the sintering aid are chemically reduced in the sintering stage, resulting in that transfer of materials accompanied with the liquid phase is disturbed. As a result, it is impossible to produce a dense fine sintered article of AlN.

The boron content in the sintered article of AlN is preferably less than 1% by weight. Increment of the boron content higher than 1% by weight make it impossible to produce a precise dense free sintered article of AlN and cause deterioration of thermal conductivity.

The surface layer for the AlN ceramics according to the present invention has preferably a thickness between 10 μm to 250 μm. If the surface layer becomes thinner than the minimum thickness, defects or void on a surface of the sintered article can not be repaired completely or satisfactorily, so that it is impossible to realize a surface layer having the surface roughness (Ra) of lower than 0.3 μm and possessing no defect larger than 25 μm. On the contrary, if the thickness exceeds the maximum value of this range, the surface layer becomes uneven so that it is impossible to to realize a surface layer having the surface roughness (Ra) of lower than 0.3 μm and possessing no defect larger than 25

In the first method for preparing aluminium nitride ceramics according to the present invention, a paste of aluminium nitride powder or oxide glass powder is prepared and applied onto a surface of the sintered article of AlN and then is sintered to form a sintered surface layer which can be polished thereafter optionally.

In the second method for preparing aluminium nitride ceramics according to the present invention, the paste for the surface layer is applied to a non-sintered aluminium nitride body and both of the paste and the non-sintered aluminum nitride body are sintered simultaneously. The resulting sintered surface layer is polished optionally.

When a powder of oxide glass is used, a surface of the sintered article of AlN can be polished and/or subjected to an oxidation treatment before the paste for the surface layer is applied. The oxidation treatment increase the wettability between the glass and the sintered article of AlN.

The oxidation treatment can be effected by burning m an oxygen-containing atmosphere or water-containing atmosphere and/or by treatment in an aqueous alkaline solution. The burning in oxygen-containing atmosphere is effected preferably under a partial pressure of oxygen gas above 100 ppm, preferably above 500 ppm. The burning in water-containing atmosphere is effected preferably at a dew point of higher than −10° C., preferably above 0° C. The burning temperature is preferably lower than 1500° C., preferably between 200° and 1,300° C. If the burning temperature is lower than the range, oxidation proceed too slowly and sufficient oxidation can not be expected. On the contrary, if the burning temperature become higher than 1500° C., a surface of the sintered article cracks due to excessive difference in thermal expansion between the sintered article of AlN and an oxide layer (alumina layer) which is produced rapidly on whole surface of the sintered article of AlN, so that it is difficult to obtain a smooth surface layer.

The treatment in aqueous alkaline solution is preferably effected at a pH higher than 10 and at liquid temperature of higher than 30° C. to accelerate the oxidation speed.

If the partial pressure of oxygen and the dew point are outside the above-mentioned limit, sufficient oxygen can not be supplied to the surface of the sintered article of AlN, so that advantage of oxidation treatment can not be expected.

The content of aluminium nitride powder or oxide glass powder in the paste for surface layer is preferably more than 50% by weight. If the content of aluminium nitride powder or of oxide glass powder is less than 50% by weight, it is impossible to form a fine dense surface layer.

When aluminium nitride powder is used in the paste for surface layer, it is preferably to use AlN powder having a particle size less than 10 μm, preferably less than 5 μm or powder produced by pulverizing a sintered body of AlN. In particular, AlN powder having a particle size lower than 5 μm is advantageous due to its improved sintering property. A dense smooth surface layer is difficult to be realized when AlN powder has a particle size larger than 10 μm. The powder having particle size of lower than 5 μm can be prepared by any method including a direct nitration method and a reductive nitridation method. In any case, the oxygen content in AlN powder is preferably lower than 2% by weight.

When oxide glass powder is used in the paste for surface layer, it is preferable to use an oxide glass powder having a particle size less than 50 μm or a pulverized product of the oxide glass. In particular, a powder having particle size less than 20 μm is preferably-due to its excellent sintering property and a powder having a particle size of less than 10 μm is more preferable. The oxide glass powder preferably do not contain Na, K Rb and Pb. Since these elements are very reactive with the sintered product of AlN, a gas such as nitrogen gas and $NO_x$ is produced when the surface layer is sintered, resulting in that formation of a fine dense smooth surface is disturbed.

The thermal expansion coefficient of the oxide glass is preferably in a range of 3.0 to 6.0 ppm/° C. The thermal expansion coefficient means the mean thermal expansion per unit temperature from a room temperature to a sintering temperature of the surface layer of oxide glass. If the thermal expansion coefficient of oxide glass is out of this range, the difference in thermal expansion between the sintered article of AlN and the surface layer of oxide glass becomes such big that cause crack and break of the sintered article of AlN and of the surface layer of oxide glass.

The smooth surface layer can be realized much easily by depositing the oxide glass layer in a structure of multi-layers. In fact, in order to realize a smooth surface, it is necessary to adjust a composition of oxide glass and to control sintering conditions, because components of the oxide glass react with aluminum nitride of the the sintered article of AlN, even if oxide glass free from Na, K, Rb and Pb is used, resulting in that the surface layer is deformed.

This problem can be solved by adopting the structure of multi-layers of oxide glass and by depositing the first oxide glass layer to be contacted with the sintered article of AlN whose softening point is higher than those of the other oxide glass layers. This solution facilitates the adjustment of oxide glass composition and control of sintering conditions. It is preferable to deposit a plurality of layers of oxide glass each whose softening point become lower gradually along a direction away from the sintered article in order to absorb thermal stress.

The thickness of each oxide glass layer ranges from 1 to 100 μm, preferably from 5 to 10 μm. A oxide glass layer of less than 1 μm may be difficult to be realized as an uniform layer so that it is difficult to realize the surface roughness (Ra) of lower than 0.3 μm of the surface layer.

The multi-layer structure of oxide glass layers can be realized by repeating a cycle of coating of the oxide glass paste on the sintered article and sintering thereof for several times. In this case, a surface of oxide glass is preferably polished after every sintering operation so as to improve the surface roughness.

Or, the multi-layer structure of oxide glass layers can be realized by forming a plurality of oxide glass paste layers successively and then sintering all the oxide glass paste layers simultaneously.

The paste for surface layer may contain, as a sintering aid, compounds of tin and/or IIIa group elements which promote sintering reaction of AlN particles. These compounds can be selected from a group consisting of oxides, carbides, nitrides and compounds which will produce them after sintering. The proportion of the compounds of IIa and/or IIIa group elements is preferably lower than 10 weight parts in term of element with respect to 100 weight parts of AlN. If the proportion exceeds 10 weight parts, excessive liquid phase ooze out of a surface of the sintered product, resulting in such a problem that the sintered product is colored with unstable spotted tone. When a colored surface layer, such as black surface layer is required, IVa, Va and VIa group element(s) can be contained in the surface layer, as a coloring agent. The IVa, Va and VIa group elements can be added in a form of at least one of compounds selected from a group consisting of oxides, carbides, nitrides and other compounds which will produce them after sintering. In order to improve the coloring effects, it is preferable to divide the IVa, Va and VIa group elements as fine as possible so as to disperse them uniformly.

The paste for the surface layer is produced by adding a solvent optionally together with an organic binder to the inorganic components. The solvent may be alcohols such as ethyl alcohol and terpineol, ketons such as methyl ketone, esters such as dibutylphthlate, butyl carbitol acetate and water. The organic binder can be added optionally to maintain the strength of a coated paste film. The organic binder is selected according to the solvent considered and may be cellulose-type resins such as ethyl cellulose and nitrocellulose, acrylic resins such as polymethyl methacrylate (PMMA) and vinyl resins such as polyvinyl alcohol (PVA) and polyvinylbutylal (PVB). A surface-active agent also can be to added so as to improve the leveling of coated paste layer.

The coated paste for surface layer is then sintered so as to increase the density of the surface layer. The sintering is effected preferably at a temperature from 1,500° to 2,100° C. Sintering of lower than 1,500° C. is not economical because the sintering speed become too slow. On the contrary, if the sintering is effected at higher than 2,100° C., AlN is decomposed and volatilized seriously, so that it is difficult to obtain a dense fine sintered article.

When oxide glass powder is used in the surface layer, the sintering is effected preferably at a temperature from 500° to 1,200° C. Sintering temperature of lower than 500° C. is not sufficient to soften glass components so that it is difficult to realize a dense fine surface layer. On the contrary, if the sintering temperature become higher than 1,200° C., reactions between AlN and glass components become intensive to generate nitrogen gas and $NO_2$ gas which will cause voids in the surface layer.

The sintering atmosphere is selected according to the nature of glass components. Air, nitrogen or a mixture thereof is preferably used. In order to reduce unevenness in baked condition and in color tone of the final sintered AlN ceramics, it is advantageous to reduce the water content in the sintering atmosphere gas. The water content in the gas can be controlled by monitoring the dew point of a gas introduced. In particular, sintered AlN ceramics having reduced unevenness in baked condition and in color tone can be obtained under a reduced water content of the atmosphere gas at a dew point of lower than −30° C.

The present invention will be described in more detail with referring to none-limitative Examples to which the present invention should not be limited.

DESCRIPTION OF THE PREFERRED EMBODIMENTS

In the Examples, atomic ratios of Y, Ca and B were determined by an inductively coupled plasma emission spectroscopy (ICP analysis), the content of C was determined by LECO method proposed by LECO Corporation in USA and the content of O was determined by the infrared absorption method. The thermal conductivity was determined by the laser flash method. The particle size of AlN was determined by measuring the maximum size of each particle in a sintered article of AlN at a cut or slit section by a scanning electronic microscope (SEM).

EXAMPLE 1

A sintered article of AlN consisting of 0.79% by weight of Y, 0.02 % by weight of Ca, 0.015% by weight of C, 0.03% by weight of B, 0.73 % by weight of O and a balance of of AlN and less than 0.1% by weight of inevitable impurities was prepared. This sintered article of AlN has a thermal conductivity of 120 W/m·K. An avenge in the particle size of 30 particles of AlN was 3.5 μm.

A paste for the surface layer was prepared by kneading 82% by weight of AlN powder whose oxygen content was 1.0% by weight produced by reduction-nitration method with a balance consisting of nitrocellulose resin and butyl-carbitol.

A surface of the sintered article of AlN was polished by a diamond grinding stone #500 and then the paste for surface layer was applied by screen printing technique at an area of 100 mm×100 mm. After the resulting paste film was leveled, the surface layer was sintered at 1,800° C. for 2 hours so that the surface layer was densified.

The surface roughness (Ra) of the resulting AlN ceramics was determined by a surface roughness gauge (Japanese Norm: JIS B0601) to find the surface roughness (Ra) of 0.1 μm. The surface layer was observed by SEM to find its thickness of 48 μm and no defect larger than 25 μm was on the surface of the surface layer.

EXAMPLE 2

The same paste for surface layer as Example 1 was screen-printed on the same sintered article of AlN as Example 1 at different thickness. Samples were sintered and evaluated by the same method as Example 1. The results are summarized in Table 1.

TABLE 1

| Sample No. | Thickness of the Surface layer (μm) | Surface Roughness (Ra) (μm) | Defects larger than 25 μm at a surface of the surface layer |
|---|---|---|---|
| 1* | 7 | 0.5 | Exist |
| 2 | 11 | 0.3 | None |
| 3 | 27 | 0.2 | None |
| 4 | 48 | 0.1 | None |
| 5 | 101 | 0.08 | None |
| 6 | 153 | 0.07 | None |
| 7 | 200 | 0.1 | None |
| 8 | 246 | 0.3 | None |
| 9* | 300 | 0.5 | Exist |

*Comparative Example

EXAMPLE 3

A sintered article of AlN consisting of 2.36% by weight of Y, 0.55 % by weight of Ca, 0.025% by weight of C, 0.05% by weight of B, 0.66 % by weight of O and a balance consisting of AlN and less than 0.1% by weight of inevitable impurities was prepared. This sintered article possessed a thermal conductivity of 255 W/m·K. An average in the particle size of 30 particles of AlN was 13.8 μm.

The same surface layer as Example 1 was applied by the same method as Example 1 and then sintered. After the resulting AlN ceramic was ground by diamond powders having a particle size of 2 μm, the samples were evaluated by the same method as Example 1.

The surface roughness (Ra) was 0.03 μm and no defect larger than 25 μm was found on a surface of the surface layer.

A sintered article of AlN consisting of 1.33% by weight of Y, 0.005% by weight of Ca, 0.025% by weight of C, 0.5% by weight of Ti, 0.03% by weight of B, 0.91% by weight of O and a balance consisting of AlN and less than 0.1% by weight of inevitable impurities. This sintered article possesses a thermal conductivity of 185 W/m·K and had dimensions of 100 mm×100 mm and a thickness of 2 mm. An average in the particle size of 30 particles of AlN was 6.5 μm. Ti compound was black and had a particle size of 0.6 μm.

A paste for the surface layer was prepared by kneading 100 parts by weight of AlN powder whose oxygen content was 1.2% by weight produced by direct nitration technique and 2.5 parts by weight of $Y_2O_3$ powder having an average particle size of 0.8 μm together with the same solvent and organic binder as Example 1. The powder content of the resulting paste for surface layer was 75% by weight.

The paste for surface layer was spinner-coated on a surface of a sintered article of AlN. After leveling, the coated surface layer was sintered for 1 hour at 1,850° C. to densify the surface layer.

The surface roughness (Ra) evaluated by the same method as Example 1 was 0.08 μm and no defect larger than 25 μm was found on a surface of the surface layer.

EXAMPLE 5

The same sintered article of AlN as Example 4 was prepared and the same paste for surface layer as Example 4 was coated at different powder contents and sintered. The coating conditions were adjusted so that the surface layer after sintering has a thickness of 50 μm±3 μm. The results are summarized in Table 2.

TABLE 2

| Sample No. | Powder content (%) | Coating Method | Surface Roughness (Ra) (μm) | Defects larger than 25 μm on a surface | Appearance of the surface layer |
|---|---|---|---|---|---|
| 10* | 45 | Spinner | 0.05 | Exist | Porous |
| 11 | 50 | Spinner | 0.05 | None | Fine |
| 12 | 60 | Spinner | 0.07 | None | Fine |
| 13 | 75 | Spinner | 0.08 | None | Fine |
| 14 | 90 | Screen print | 0.1 | None | Fine |
| 15 | 95 | Screen print | 0.2 | None | Fine |

*Comparative Example

EXAMPLE 6

The AlN ceramic obtained in Example 4 was polished by diamond abrasive grains having the particle size of 1.2 μm.

The surface roughness (Ra) determined the same method as Example 1 was 0.015 μm and no defect larger than 3 μm was found on a surface of the surface layer.

EXAMPLE 7

A sintered article of AlN consisting of 0.79% by weight of Y, 0.02 % by weight of Ca, 0.015% by weight of C, 0.03% by weight of B, 0.73 % by weight of O and a balance of of AlN and less than 0.1% by weight of inevitable impurities was prepared. This sintered article of AlN has a thermal conductivity of 120 W/m·K. An average in the particle size of 30 particles of AlN was 3.5 μm.

A paste for the surface layer was prepared by kneading 82% by weight of oxide glass powder containing 25% by weight of Si, 8% by weight of Al, 7% by weight of B and very small amounts of Sn, Mg, Fe, V and Cr with a balance consisting of nitrocellulose resin and butylcarbitol. The thermal expansion coefficient of the oxide glass used was 3.7 ppm/° C.

A surface of the sintered article of AlN was polished by a diamond grinding stone #500 and then the paste for surface layer was applied by screen printing technique at an area of 100 mm×100 μmm. After the resulting paste film was leveled, the surface layer was sintered at 800° C. for 30 minutes so that the surface layer was densified.

The surface roughness (Ra) of the resulting AlN ceramics was determined by a surface roughness gauge (Japanese Norm: JIS B0601) to find the surface roughness (Ra) of 0.06 μm. The surface layer was observed by SEM to find its thickness of 48 μm and no defect larger than 25 μm was on the surface of the surface layer.

EXAMPLE 8

The same paste for surface layer as Example 7 was screen-printed on the same sintered article of AlN as Example 7 at different thickness. Samples were sintered and evaluated by the same method as Example 7. The results are summarized in Table 3.

TABLE 3

| Sample No. | Thickness of the Surface layer (μm) | Surface Roughness (Ra) (μm) | Defects larger than 25 μm at a surface of the surface layer |
| --- | --- | --- | --- |
| 1* | 6 | 0.5 | Exist |
| 2 | 11 | 0.3 | None |
| 3 | 24 | 0.1 | None |
| 4 | 50 | 0.06 | None |
| 5 | 99 | 0.05 | None |
| 6 | 151 | 0.08 | None |
| 7 | 202 | 0.2 | None |
| 8 | 247 | 0.3 | None |
| 9* | 300 | 0.5 | Exist |

*Comparative Example

EXAMPLE 9

A sintered article of AlN consisting of 2.36% by weight of Y, 0.55 % by weight of Ca, 0.025% by weight of C, 0.05% by weight of B, 0.66 % by weight of O and a balance consisting of AlN and less than 0.1% by weight of inevitable impurities was prepared. This sintered article possessed a thermal conductivity of 255 W/m·K. An average in the particle size of 30 particles of AlN was 13.8 μm.

The same surface layer as Example 7 was applied by the same method as Example 7 and then sintered. After the resulting AlN ceramic was ground by diamond powders having a particle size of 1.5 μm, the samples were evaluated by the same method as Example 7.

The surface roughness (Ra) was 0.03 μm and no defect larger than 25 μm was found on a surface of the surface layer.

EXAMPLE 10

A sintered article of AlN consisting of 1.33% by weight of Y, 0.005% by weight of Ca, 0.025% by weight of C, 0.5% by weight of Ti, 0.03% by weight of B, 0.91% by weight of O and a balance consisting of AlN and less than 0.1% by weight of inevitable impurities. This sintered article possesses a thermal conductivity of 185 W/m·K and had dimensions of 100 mm×100 mm and a thickness of 2 mm. An average in the particle size of 30 particles of AlN was 6.5 μmm. Ti compound was black and had a particle size of 0.6 μm.

A paste for the surface layer was prepared by kneading 75% by weight of oxide glass powder containing 22% by weight of Si, 11% by weight of Al, 5% by weight of Ca, 1% by weight of Zr and very small amounts, Fe, Bi, B and P (a balance consists mainly of oxygen) with nitrocellulose resin and butylcarbitol acetate. The oxide glass used has a thermal expansion coefficient of 5.5 ppm/° C.

The paste for surface layer was spinner-coated on a surface of a sintered article of AlN. After leveling, the coated surface layer was sintered for 1 hour at 1,050° C. to densify the surface layer.

The surface layer has a thickness of 48 μm. The surface roughness (Ra) evaluated by the same method as Example 7 was 0.05 μm and no defect larger than 25 μm was found on a surface of the surface layer.

EXAMPLE 11

The same sintered article of AlN as Example 10 was prepared and the same paste for surface layer as Example 10 was coated at different powder contents and sintered. The coating conditions were adjusted so that the surface layer after sintering has a thickness of 50 μm±3 μm. The results are summarized in Table 4.

TABLE 4

| Sample No. | Powder content (%) | Coating Method | Surface Roughness (Ra) (μm) | Defects larger than 25 μm on a surface | Appearance of the surface layer |
| --- | --- | --- | --- | --- | --- |
| 10* | 45 | Spinner | 0.08 | Exist | Porous |
| 11 | 50 | Spinner | 0.04 | None | Fine & smooth |
| 12 | 60 | Spinner | 0.04 | None | Fine & smooth |
| 13 | 75 | Spinner | 0.05 | None | Fine & smooth |
| 14 | 90 | Screen printing | 0.08 | None | Fine & smooth |
| 15 | 95 | Screen printing | 0.1 | None | Fine & smooth |

*Comparative Example

EXAMPLE 12

The AlN ceramic obtained in Example 10 was polished by diamond abrasive grains having the particle size of 1 μm.

The surface roughness (Ra) determined the same method as Example 7 was 0.012 μm and no defect larger than 3 μm was found on a surface of the surface layer.

EXAMPLE 13

The procedure of Example 7 was repeated but the sintered article was changed. Namely, a sintered article was oxidation-treated.

A sintered article of AlN consisting of 0.95% by weight of Y, 0.02 % by weight of Ca, 0.033% by weight of C, 0.05% by weight of B, 0.85 % by weight of O, 1.03% by weight of W and a balance of AlN and less than 0.1% by weight of inevitable impurities was prepared. This sintered article of AlN has a thermal conductivity of 165 W/m·K. An average in the particle size of 30 particles of AlN was 3.8 μm.

This sintered article of AlN was oxidized in an atmosphere of a mixed gas consisting of 5% of oxygen and 95% of nitrogen at 1,050° C. for 1 four. After the oxidation treatment, a treated surface of the sintered article of AlN was polished by a diamond whetstone #500.

Then, the same paste for surface layer as Example 7 was screen-printed on the treated surface and was sintered by the same procedure as Example 7.

The surface roughness (Ra) of the resulting sintered article of AlN was 0.06 μm. The surface layer observed by SEM had a thickness of 50 μm and no defect larger than 10 μm was found on the surface.

EXAMPLE 14

The same procedure as Example 13 was repeated except that the sintered article of AlN was oxidized in air at 750° C. for 2 hours.

The surface roughness (Ra) of the resulting sintered article of AlN was 0.05 μm. The surface layer observed by SEM had a thickness of 52 μm and no defect larger than 10 μm was found on the surface.

EXAMPLE 15

On a surface of a AlN ceramic plate having a dimension of 100 mm×100 mm and a thickness of 3.0 mm, a first oxide glass paste having a softening point of 880° C. and a thermal expansion coefficient of 4 ppm/° C. was coated by screen-printing technique and was sintered in air at 1,000° C. for 2 hours to obtain a sintered first oxide glass layer having a thickness of about 6 μm.

Then a second oxide glass paste having a softening point of 800° C. and a thermal expansion coefficient of 3.5 ppm/° C. was coated on the first oxide glass layer by screen-printing and was sintered in air at 900° C. for 1 hour to obtain a sintered second oxide glass layer having a thickness of about 5 μm.

Finally, a third oxide glass paste having a softening point of 700° C. and a thermal expansion coefficient of 3.8 ppm/° C. was coated on the second oxide glass layer by screen-printing and was sintered in air at 800° C. for 30 minutes to obtain a sintered second oxide glass layer having a thickness of about 7 μm.

The resulting sample was observed by an optical microscope (×400) to find no defect on its outer surface layer. The surface roughness (Ra) of the outer surface layer was 0.02 μm.

We claim:

1. Aluminum nitride ceramic comprising a sintered article comprising mainly aluminum nitride and having a thermal conductivity higher than 100 W/m·K at room temperature and a smooth dense surface layer comprising mainly aluminum nitride formed on a surface of said sintered article and having a surface roughness (Ra) of lower than 0.3 μm, no defect larger than 25 μm being found on a surface of said surface layer, and said surface layer having a thickness of 10 to 250 μm.

2. An aluminum nitride ceramic as claimed in claim 1, wherein said aluminum nitride sintered article is made of particles whose particle sizes are larger than 2 μm.

3. An aluminum nitride ceramic as claimed in claim 1, which further comprises a metallized layer deposited on the surface layer.

4. An aluminum nitride ceramic as claimed in claim 1, wherein the sintered article comprises more than 80% by weight of aluminum nitride.

5. An aluminum nitride ceramic as claimed in claim 1, wherein the surface layer comprises at least 50% by weight of aluminum nitride.

6. An aluminum nitride ceramic as claimed in claim 1, wherein the surface layer is formed by sintering aluminum nitride powder having a particle size of less than 10 μm.

7. Aluminum nitride ceramic comprising a sintered article comprising mainly aluminum nitride and having a thermal conductivity higher than 100 W/m·K at room temperature and a smooth dense surface layer comprising mainly oxide glass formed on a surface of said sintered article and having a surface roughness (Ra) of lower than 0.3 μm, no defect larger than 25 μm being found on a surface of said surface layer, and said surface layer having a thickness of 10 to 250 μm, wherein at least a first oxide glass layer formed directly on a surface of said sintered article is made of oxide glass containing none of Na, K, Rb, and Pb.

8. An aluminum nitride ceramic as claimed in claim 7, wherein said oxide glass possess a thermal expansion coefficient of 3.0 to 6.0 ppm/°C.

9. An aluminum nitride ceramic as claimed in claim 7, wherein said surface layer has a multi-layered structure consisting of a plurality of oxide glass layers.

10. An aluminum nitride ceramic as claimed in claim 9, wherein differences in softening point among said oxide glass layers are larger than 5° C.

11. An aluminum nitride ceramic as claimed in claim 9, wherein each of said oxide glass layers has a thickness of 1 to 100 μm.

12. An aluminum nitride ceramic as claimed in claim 7, which further comprises a metallized layer deposited on the surface layer.

13. An aluminum nitride ceramic as claimed in claim 7, wherein the sintered article comprises more than 80% by weight of aluminum nitride.

14. An aluminum nitride ceramic as claimed in claim 7, wherein the surface layer comprises at least 50% by weight of oxide glass.

15. An aluminum nitride ceramic claimed in claim 7, wherein the surface layer is formed by sintered oxide glass powder having a particle size of less than 50 μm.

16. An integrated circuit comprising a substrate which comprises an aluminum nitride ceramic as set forth in claim 1.

17. A packaging material comprising a substrate which comprises an aluminum nitride ceramic as set forth in claim 1.

18. An integrated circuit comprising a substrate which comprises an aluminum nitride ceramic as set forth in claim 7.

19. A packaging material comprising a substrate which comprises an aluminum ceramic as set forth in claim 7.

* * * * *